United States Patent
Kitching et al.

(10) Patent No.: US 6,831,522 B2
(45) Date of Patent: Dec. 14, 2004

(54) METHOD OF MINIMIZING THE SHORT-TERM FREQUENCY INSTABILITY OF LASER-PUMPED ATOMIC CLOCKS

(75) Inventors: John Kitching, Boulder, CO (US); Leo Hollberg, Boulder, CO (US); Robert Wynands, Hannover (DE); Svenja Knappe, Trier (DE)

(73) Assignee: The United States of America as represented by the Secretary of Commerce, Washington, DC (US)

( * ) Notice: Subject to any disclaimer, the term of this patent is extended or adjusted under 35 U.S.C. 154(b) by 386 days.

(21) Appl. No.: 10/175,324

(22) Filed: Jun. 20, 2002

(65) Prior Publication Data

US 2002/0175767 A1 Nov. 28, 2002

Related U.S. Application Data

(60) Provisional application No. 60/303,911, filed on Jul. 9, 2001.

(51) Int. Cl.$^7$ ................................................. H03L 7/26
(52) U.S. Cl. ................................................................ 331/3
(58) Field of Search ............................... 331/3, 94.1

(56) References Cited

U.S. PATENT DOCUMENTS

| | | | |
|---|---|---|---|
| 4,349,798 A | | 9/1982 | Podell et al. |
| 4,494,085 A | | 1/1985 | Goldberg |
| 4,495,478 A | | 1/1985 | Kwon et al. |
| 5,192,921 A | | 3/1993 | Chantry et al. |
| 5,327,105 A | | 7/1994 | Liberman et al. |
| 5,491,451 A | * | 2/1996 | English .......................... 331/3 |
| 5,670,914 A | | 9/1997 | Liberman et al. |
| 6,133,800 A | | 10/2000 | Deng |
| 6,201,821 B1 | | 3/2001 | Zhu et al. |
| 6,215,366 B1 | | 4/2001 | Kern et al. |
| 6,222,424 B1 | | 4/2001 | Janssen et al. |
| 6,225,870 B1 | | 5/2001 | Mei et al. |
| 6,255,647 B1 | | 7/2001 | Vanier et al. |
| 6,265,945 B1 | | 7/2001 | Delaney et al. |
| 6,320,472 B1 | | 11/2001 | Vanier et al. |
| 6,333,942 B1 | | 12/2001 | Nakazawa et al. |
| 6,359,916 B1 | | 3/2002 | Zhu |
| 6,359,917 B1 | | 3/2002 | Cutler et al. |
| 6,363,091 B1 | | 3/2002 | Zhu et al. |
| 6,570,459 B1 | | 5/2003 | Nathanson et al. |

OTHER PUBLICATIONS

Kitching, J. et al., "Frequency–dependent optical pumping in atomic–Λ–systems", Optics Letters, vol. 26, No. 19, pp. 1507–1509 (Oct. 1, 2001).

Kitching, J. et al., "Optical–pumping noise in laser–pumped, all–optical microwave frequency references", J. Opt. Soc. Am. B, vol. 18, No. 11, pp. 1676–1683 (Nov. 2001).

* cited by examiner

*Primary Examiner*—David Mis
(74) *Attorney, Agent, or Firm*—Stevens, Davis, Miller & Mosher, L.L.P.

(57) ABSTRACT

A method is provided for optimizing the performance of laser-pumped atomic frequency references with respect to the laser detuning and other operating parameters. This method is based on the new understanding that the frequency references short-term instability is minimized when (a) the laser frequency is tuned nominally a few tens of MHz away from the center of the atomic absorption line, and (b) the external oscillator lock modulation frequency is set either far below or far above the inverse of the optical pumping time of the atoms.

15 Claims, 2 Drawing Sheets

METHOD OF MINIMIZING THE SHORT-TERM FREQUENCY INSTABILITY OF LASER-PUMPED ATOMIC CLOCKS

CROSS REFERENCE TO RELATED APPLICATIONS

This application is a non-provisional application of provisional application number 60/303,911 filed on Jul. 9, 2001, which is hereby incorporated by reference as if fully set forth herein.

BACKGROUND OF THE INVENTION

1. Field of the Invention

This invention relates to laser-pumped atomic clocks, and more particularly, to a method of optimizing the performance of laser-pumped atomic frequency references with respect to optical pumping noise by detuning the laser frequency and adjusting other controllable operating parameters.

2. Background of the Invention

Frequency references with high stability are required for modem, high-speed communications systems and similar applications. Atomic frequency references or standards are based on the energy difference between two levels of a quantum system. In an atom, for example, quantum mechanics requires that the electrons can only exist in certain states with specific, discrete energies. Differences between the energies of these states define correspondingly specific frequencies that are, to a high degree, similar for every atom, and therefore atoms make good frequency references.

A dipole moment, oscillating at one of these frequencies, can be excited by an electromagnetic wave propagating in the same space as the atom. Frequency references are available that employ an excitation scheme in which microwave fields excite the atoms of a sample. When the microwave frequency exactly corresponds to the atomic oscillation frequency, a change in the atomic state occurs which can be detected by measuring the absorption of an optical field propagating simultaneously through the atomic sample.

All-optical excitation techniques have been developed, in which no microwaves are applied directly to the atoms. Instead the injection current of a laser is modulated with an external oscillator to produce two optical fields separated by the atomic oscillation frequency, and this laser field is passed through the atomic system. When the difference frequency of the two optical fields is near the atomic oscillation frequency, a change in the absorption of the field by the atoms occurs. This change in absorption, due to a phenomenon called coherent population trapping (CPT), can be used to lock the external oscillator frequency to the atomic transition. This locked frequency provides the output of the frequency reference and has the long-term stability and repeatability inherent to the atoms.

Hence, all available frequency standards generate a detection signal that quantifies a resonant interaction between an incident electromagnetic radiation and a quantum absorber.

The shift in atomic energy levels due to applied electric fields is well known as the Stark effect, but for electric dipole transitions between states of well defined parity only the second order effect is non-zero (quadratic Stark effect or shift). The magnitude of the total AC Stark shift is an important aspect in defining the performance of frequency standards, in general. U.S. Pat. Nos. 6,201,821 and 6,363,091, both to Zhu et al., teach a frequency standard based on CPT comprising a quantum absorber and the quantum absorber, respectively, in which the magnitude of total AC Stark shift is reduced. U.S. Pat. No. 6,222,424 to Janssen et al., teaches an optically pumped frequency standard in which the AC Stark shift is reduced by actively controlling the intensity of excitation light independently of the optical pump.

Noise is present in the frequency reference and is caused, in part, by fluctuations in the frequency of the optical probe field (FM-AM conversion noise). Detection in available frequency standards described above is limited by the signal-to-noise ratio of the detection signal. U.S. Pat. No. 6,359,917 to Cutler et al., teaches a detection method and detector having a detection signal that is a combination of two signals such that the signal-to-noise ratio of the detection signal is greater than that of either of its two component detection signals. The improved signal-to-noise ratio of the detection signal taught by Cutler et al. enables the detection signal to provide a more accurate and stable quantification of the resonance condition of interest.

SUMMARY OF THE INVENTION

The present invention optimizes the performance of laser-pumped atomic frequency references by minimizing the noise source originating from optical pumping. This method is based on a new understanding of FM-AM conversion and optical pumping processes wherein the frequency reference short-term instability is minimized when (a) the laser frequency is tuned nominally a few tens of MHz away from the center of the atomic absorption line, and (b) the modulation frequency of the servo used to lock the external oscillator is set either far below or far above the inverse of the optical pumping time of the atoms. The exact parameters for the optimization depend on the particular experimental situation. In one embodiment these parameters can be approximately calculated using a model simulating the clock performance. This model is described in J. Kitching, L. Hollberg, S. Knappe and R. Wynands, Opt. Lett. 26, 1507, 2001 and J. Kitching, H. G. Robinson, L. Hollberg, S. Knappe and R. Wynands, J. Opt. Soc. Am. B 18, 1676, 2001), the entire contents of both of which are hereby incorporated by reference as if fully set forth herein. The atomic frequency reference of the current invention is sufficiently stable and reproducible over the short term to provide a clock at each node of a network that can be relied upon to independently maintain synchronization should a controlling mechanism, such as the Global Positioning System or GPS, be unavailable to provide a clocking reference to the nodes of the network.

The frequency reference of the present invention is compact and can be located wherever a hold-over clock is needed, such as in communication network base stations. Other applications include LAN synchronization, instrumentation and calibration, and secure communications. Small atomic clocks can be used in anti-jamming measures and in identifying systems.

DETAILED DESCRIPTION OF THE INVENTION

Figure 1:
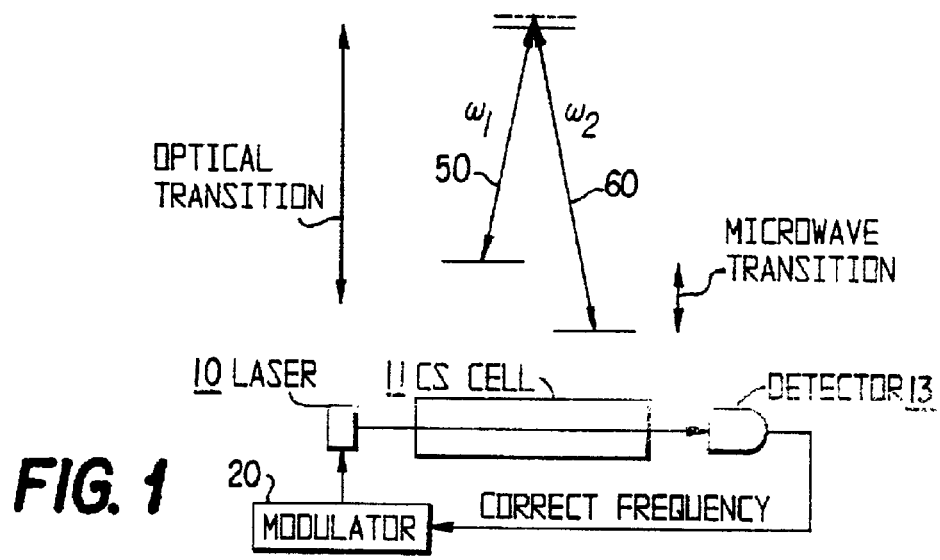
FIG. 1 illustrates an all-optical excitation technique using a Cesium resonance cell.
Figure 4:
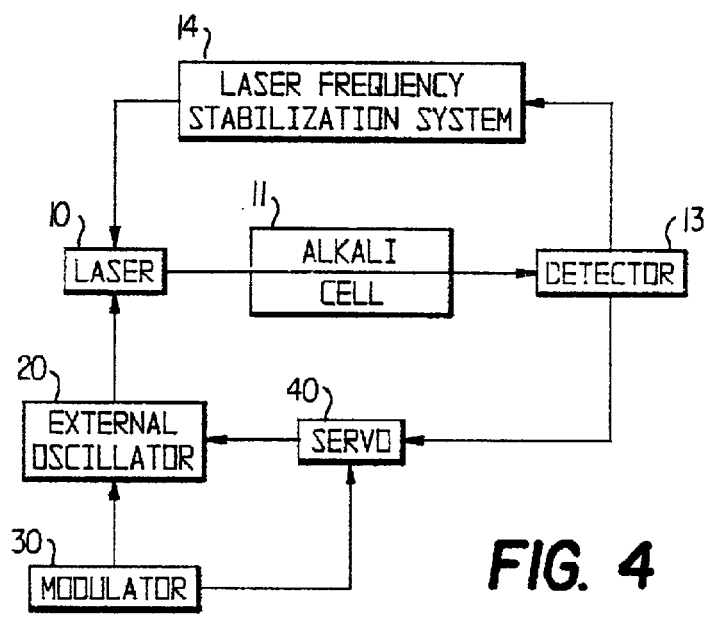
FIG. 4 illustrates an all-optical excitation technique using an alkali cell, e.g., Cesium or Rubidium, resonance cell.

Referring now to FIGS. 1 and 4, an atomic frequency reference employing all-optical excitation techniques is illustrated. The present invention provides a method of optimizing the performance of such a laser-pumped atomic frequency reference with respect to the laser 10 detuning and other operating parameters. An optical field produced by a laser 10 is modulated by an external oscillator 20 to produce two optical fields separated by the atomic oscillation frequency, and this laser field is passed through an atomic system 11. When the difference frequency of the two optical fields is near the atomic oscillation frequency, a change in the absorption of the field by the atoms contained in cell 11 occurs. This change in absorption, due to a phenomenon called coherent population trapping (CPT), is detected by detector 13 and, referring now to FIG. 4, is used by the laser frequency stabilization system 14 to lock the frequency of the external oscillator to the atomic transition. This locked frequency provides the output of the frequency reference and has the long-term stability and repeatability inherent to the atoms. The frequency of the external oscillator 20 is itself modulated at a low frequency (<1 kHz) with a modulator 30 and a servo system 40 stabilizes the external oscillator 20 onto the atomic transition. The exact parameters for the optimization depend on the particular experimental situation.

In a preferred embodiment, these parameters are approximated as follows. The minimum noise occurs when the laser is optically detuned from the peak of the DC absorption profile by an amount $$f_{\delta S_{min}} = \frac{\beta_{10}^2 - \beta_{20}^2}{\Omega^2 \tau^2 + (\beta_{10} + \beta_{20})^2} \Delta$$

where $\Delta$ is the frequency splitting between the lower ground state absorption profile and the upper ground state absorption profile, $\Omega$ is the servo modulation frequency, $\tau$ is the atomic hyperfine coherence decay rate, and $$\beta_{10,20} = R_{10,20} \tau/2 = \phi_c I_{opt}^{1,2} \tau/2.$$

Here $R_{10,20}$ is the optical pumping rate for optical field components $\omega_1 50$ and $\omega_2 60$ (see FIG. 1) with intensities $I_{opt}^{1,2}$ and $\phi_c$ is a constant equal to 2.6 Hz/($\mu$W/cm$^2$) for Cesium. The servo modulation angular frequency $\Omega$ is optimized with respect to the optical pumping noise when it is either much larger or much smaller than the optical pumping rate $\phi_c(I_{opt}^1 + I_{opt}^2)2\pi$.

Figure 2:
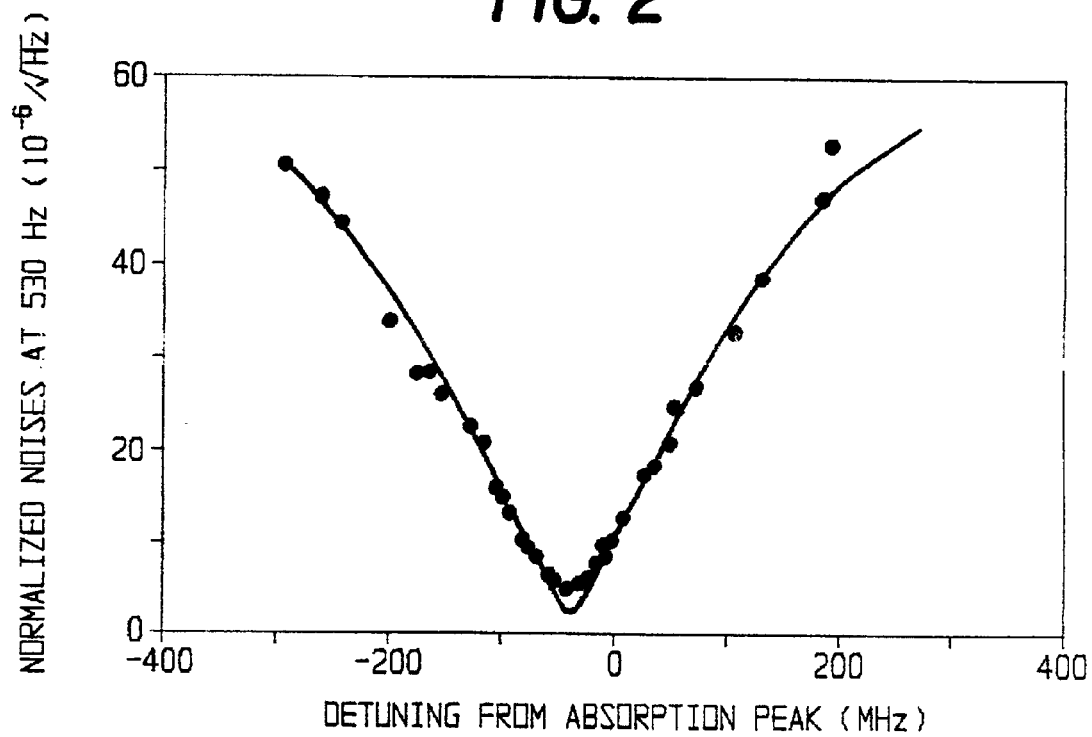
FIG. 2 illustrates that the noise minimum does not occur when the laser is tuned to the peak of an absorption line but when it is tuned a few tens of MHz away from the line peak.

The present invention enhances the performance of laser-pumped atomic frequency references by improving their frequency stability and is based on the discovery that optical pumping between the atomic ground state hyperfine levels alters the parameter values for which the noise, and therefore also the frequency reference instability, is a minimum. In particular, the noise minimum does not, in fact, occur when the laser is tuned to the peak of the absorption line, see FIG. 2. It has been thought until now that the noise is minimized when the optical field is tuned to the peak of the atomic absorption profile and that, under this condition, the contribution of laser frequency fluctuations to the frequency reference instability is near zero.

Figure 3:
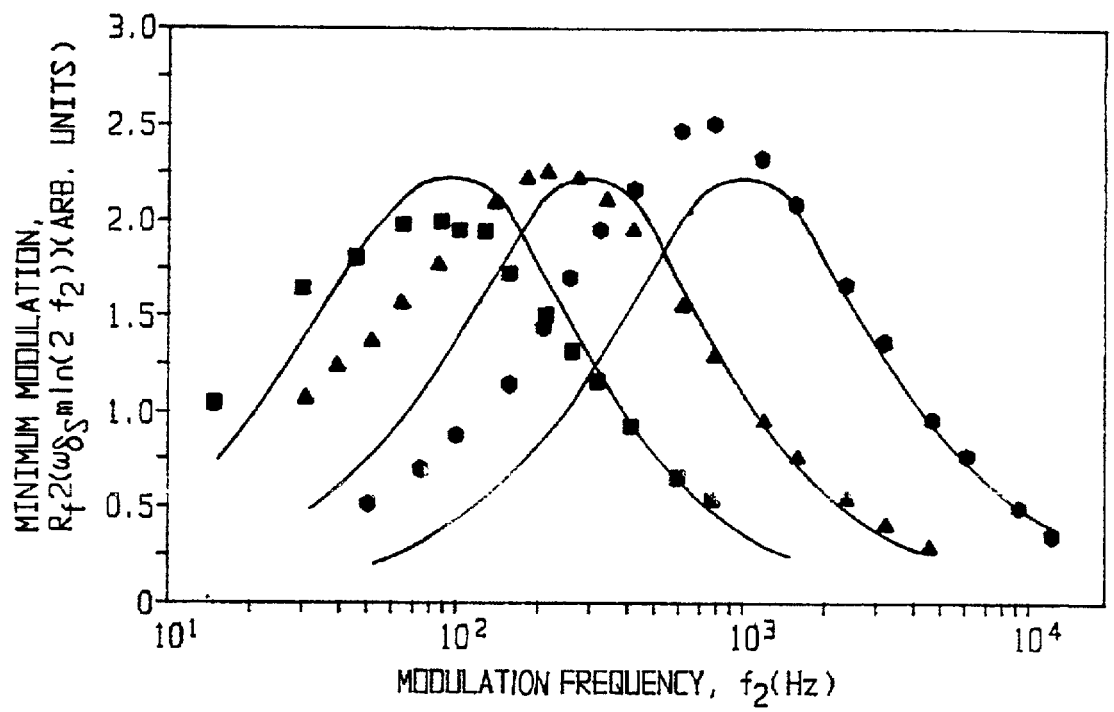
FIG. 3 illustrates that detuned optical pumping generates additional noise that prevents the FM-AM conversion contribution from being completely eliminated at any laser detuning. The figure shows the AM noise (ordinate) generated when the frequency of the laser is modulated (FM noise, abscissa). The FM-AM noise conversion is expected to show an equivalent behavior.

However, it has been discovered by the inventors that the noise minimum actually occurs when the laser is tuned a few tens of MHz away from the line peak. In addition, this optical pumping process generates additional noise that prevents the FM-AM conversion contribution from being completely eliminated at any detuning, see FIG. 3. In order to reduce this noise contribution, in a preferred embodiment, the frequency of modulation used in locking the external oscillator to the atomic resonance must be one of much higher or much lower frequency than the inverse of the optical pumping time. The optical pumping time for typical frequency references is of the order of 1 ms. Under these conditions, the FM-AM conversion noise is minimized and the frequency reference stability is optimized.

In a preferred embodiment, the optimization is achieved by a method comprising the steps of (a) detuning the laser 10 slightly from the absorption peak, and (b) choosing correctly the external reference modulation frequency that optimizes the performance of the frequency reference. In one embodiment, the following parameters are employed: Alkali atom: Cs, laser power: 5 $\mu$W, beam diameter: 4 mm, buffer gas: 6 kPa of Ne, cell temperature: 30 C, cell diameter: 2 cm. With these parameters, the laser detuning of −40 MHz will optimize the noise. The external oscillator modulation frequency should be below 250 Hz or above 1 kHz.

One familiar with the art will realize that various controllable operating parameters are possible, depending on the particular application, without departing from the essential scope or spirit of the invention as claimed. Accordingly, the examples of embodiments are presented, not in any limiting sense, but for purposes of illustration.

What is claimed is:

1. A method for optimizing performance of an atomic reference standard, comprising:

providing an atomic frequency standard comprising a resonance cell to contain an atomic resonance source material which is prepared in a superposition of atomic energy levels and detected with an optical field in an optical pumping process to produce an output frequency reference equal to at least one of the atomic transition and another frequency coherently generated from the atomic transition; and detuning the optical field frequency from an absorption peak of the atomic resonance source material, wherein, noise on the output frequency reference is minimized and the stability of the frequency standard is optimized.

2. The method of claim 1, further comprising the step of exciting the atomic resonance source material by one of:

a. direct microwave excitation, and b. an all-optical coherent preparation of the atomic resonance source material with a laser field comprising at least two frequency components.

3. The method of claim 2, further comprising the steps of:

providing an external oscillator that excites the atoms at their resonant frequency;

providing an active servo to control the external oscillator; and locking the frequency of the external oscillator with a frequency of the atomic transition by the active servo.

4. The method of claim 3, wherein the step of locking of the frequency of the external oscillator to the atomic transition with the active servo locks the frequency to one of more than a factor of two higher frequency and more than a factor of two lower frequency than the inverse of the optical pumping time such that noise generated by the optical pumping process is minimized.

5. The method of claim 3, further comprising the step of: detuning said laser by an amount equal to $$f_{\delta s_{min}} = \frac{\beta_{10}^2 - \beta_{20}^2}{\Omega^2 \tau^2 + (\beta_{10} + \beta_{20})^2} \Delta$$

wherein $\beta_{10,20} = R_{10,20} \tau/2 = \phi_c I_{opt}^{1,2} \tau/2$., $\Delta$ is a frequency splitting between a lower ground state absorption profile and a upper ground state absorption profile, $\Omega$ is the servo modulation frequency, $\tau$ is an atomic hyperfine coherence decay rate, $R_{10,20}$ is the optical pumping rate for the optical field having first and second components, respectively $\omega_1$ and $\omega_2$ with intensities $I_{opt}^{1,2}$ and $\phi_c$ is a constant; and optimizing the servo modulation angular frequency $\Omega$ with respect to the optical pumping noise by setting it equal to one of a value much larger or much smaller than the optical pumping rate $\phi_c(I_{opt}^1 + I_{opt}^2)/2\pi$.

6. A magnetometer comprising magnetic-sensitive atomic energy levels optimized according to the method of claim 1.

7. The method of claim 1, further comprising the step of exciting the atomic resonance source material by an all-optical coherent preparation of the atomic resonance source material with a laser field comprising at least two frequency components.

8. An atomic frequency reference that minimizes short-term frequency instability, comprising:

a resonance cell containing an atomic resonance source material;

a laser light source for generating an optical signal which is passed through said resonance cell having an optical pumping time, to optically pump said atomic resonance source material through an optical pumping process that produces an output optical signal therefrom;

a photodetector to detect said output optical signal and produce an output signal responsive thereto; and a laser-frequency-stabilization system to receive said output signal of said photodetector and detune and lock said laser light source from an absorption peak of the atomic resonance source material, wherein, said locked laser light source is part of a frequency reference, noise on the frequency reference is minimized and the short-term stability of the frequency standard is optimized.

9. The atomic frequency reference of claim 8, further comprising:

an external oscillator which modulates the optical field; and an active servo for locking the frequency of the external oscillator to the atomic resonance.

10. The atomic frequency reference of claim 9, wherein said servo locks said external oscillator to a frequency that is one of a factor of two higher frequency and a factor of two lower frequency than the inverse of the optical pumping time such that the noise generated by optically pumping is minimized.

11. The atomic frequency reference of claim 8, wherein said atomic resonance source material is one of cesium and rubidium.

12. A LAN comprising the atomic frequency reference of claim 8.

13. An instrument calibration system comprising the atomic frequency reference of claim 8.

14. An identification system comprising the atomic frequency reference of claim 8.

15. An anti-jamming apparatus comprising the atomic frequency reference of claim 8.

* * * * *